REMOTE CONTROL APPARATUS

Original Filed June 15, 1956 2 Sheets-Sheet 1

United States Patent Office

Re. 25,559
Reissued Apr. 21, 1964

25,559

REMOTE CONTROL APPARATUS

Lawrence R. Travis, Melrose Park, Pa., and William R. Petrick, Kenilworth, N.J., assignors to Westinghouse Electric Corporation, East Pittsburgh, Pa., a corporation of Pennsylvania Original No. 2,905,014, dated Sept. 22, 1959, Ser. No. 591,728, June 15, 1956. Application for reissue Mar. 27, 1961, Ser. No. 98,727
14 Claims. (Cl. 74—472)

Matter enclosed in heavy brackets [ ] appears in the original patent but forms no part of this reissue specification; matter printed in italics indicates the additions made by reissue.

This invention relates to remote control systems and more particularly to a remote control system for television receivers and the like.

Various remote control systems have been proposed for actuation of the controls of a television receiver, but most of them have had serious limitations. Prior art apparatus designed for actuation of the channel-selection shaft of a television receiver from a remote point are generally expensive. Furthermore, apparatus of the above type usually employ an actuation of the channel-selection shaft which is performed at a constant rate of speed. Apparatus utilizing this manner of actuation is severe on the tuner of the receiver.

It is an object of our invention, therefore, to provide means for controlling the angular movement of a shaft in a constant acceleration and deceleration manner.

It is another object of our invention to provide means for controlling the angular movement of the tuning shaft of a television receiver from a remote point in a constant acceleration and deceleration manner.

It is still another object of our invention to provide a remote control system which permits tuning of a television receiver from a remote point which is low in cost and satisfactory in operation.

It is still another object of our invention to provide a remote control system to enable operation of a television receiver to be controlled from a remote point, such remote control operation including channel selection, fine tuning and volume control of the receiver, which is low in cost and has a minimum of remote control or auxiliary mechanism.

It is still another object of our invention to provide a remote control system for the actuation of a tuner of a television receiver that is comparatively less severe in operation on the tuner.

It is still another object of our invention to provide a remote control system to enable a television receiver to be controlled in its channel selection operation from a remote point, such system being designed so that it does not interfere with the local control of the receiver.

It is still another object of our invention to provide a remote control system to enable a television receiver to be controlled from a remote point in its channel selection, fine tuning and volume control operations, such system being designed so that it does not interfere with local control of the receiver.

It is a still further object to provide a remote control system for the tuner of a television receiver in which the channels to be tuned in by remote control may be preselected easily by an operator of the receiver.

It is a still further object of our invention to provide a remote control system for the tuner of a television receiver in which preselected channels may be easily bypassed by an operator of the receiver.

These and other objects are effected by our invention as will be apparent from the following description taken in accordance with the accompanying drawings throughout which like reference characters indicate like parts, and in which.

Figure 1:
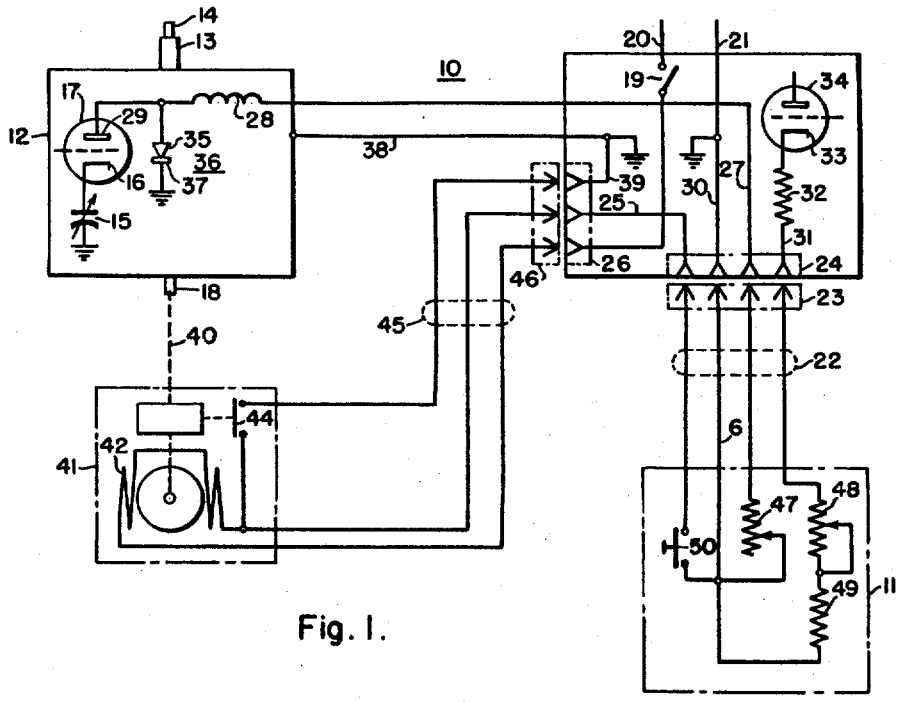
FIGURE 1 is a schematic and circuit diagram showing our remote control system.

Referring to FIG. 1 in detail, a television receiver 10 is provided with control means for turning it on and off, for selection of the desired station channel, for fine tuning of the selected station channel, and for adjusting the audio volume.

In this invention, as hereinafter explained, these control means may be selectively actuated by an operator either at the receiver by adjustment of appropriate control shafts or at a location remote from the receiver by the adjustment of control elements provided within a remote control unit 11.

The television receiver 10 is provided with a tuner 12 having concentric outer and inner shafts 13 and 14 extending from the front thereof and adapted to project through a suitable aperture provided in the receiver cabinet (not shown). The inner shaft 14 may be adjusted at the receiver to provide for fine tuning. Adjustment of the inner shaft 14 may control the variable capacitor 15 connected between the cathode 16 of the oscillator tube 17 and ground potential. The outer shaft 13 may be adjusted at the receiver to select a desired station channel. The outer shaft 13 is provided with a portion 18 adapted to project through the back of the tuner 12 and to be coupled to a drive mechanism so that desired station channels may be selected from a remote location. Another control shaft may be provided (not shown), the adjustment of which allows an operator to actuate an on-off switch 19 and additionally may serve as a means to adjust the audio volume to a desired level.

The receiver 10 is connected by power supply leads 20 and 21 to the available alternating current power line, usually a 110 volt, 60 cycle line. The remote control unit 11 is energized by means of a cable 22 which is adapted to extend through the back cover of the receiver to the remote control unit 11. The cable 22 is provided with a plug 23 adapted to be inserted in a socket 24 located at the receiver. From the socket 24 a lead 25 may be traced to another receiver socket 26, another lead 27 may be traced through an inductance 28 to the plate 29 of tube 17, another lead 30 may be traced to the power supply lead 21 which in turn is connected to ground potential, and another lead 31 may be traced to one end of a resistor 32, the other end of resistor 32 which is connected to the cathode 33 of audio power amplifier tube 34. The plate 29 of the tube 17 is connected to the plate 35 of a frequency control element 36. The cathode 37 of element 36 is connected to ground potential. The power supply lead 20 is connected through the on-off switch 19 to the socket 26. From a lead 38, which connects the tuner 12 to ground potential, a lead 39 may be traced to the socket 26.

The portion 18 of the channel-selection shaft 13 is connected through a flexible coupling 40 to channel-selection drive mechanism 41, where as hereinafter explained, the channel-selection shaft 13 may be driven or controlled at a desired rate of speed by an electric motor 42. The channel-selection drive mechanism 41, which comprises the motor 42, is mounted on a bracket 43 (FIGS. 2 and 3) along with a switch 44. A cable 45 has a plug 46 which is adapted to plug into the socket 26 to supply energizing potential to the motor 42.

Remote control unit 11 is provided with a fine tuning element 48 connected as a potentiometer in series with a resistor 49 in the plate circuit of the tube 17, a volume control element 47 connected in the cathode circuit of the tube 34, and a push button switch 50.

At the remote control unit 11, an operator can initially actuate the channel-selection drive mechanism 41 by closing the switch 50. By adjustment of the volume control element 47, the operator can raise or lower the audio level. By adjustment of the fine tuning element 48, the operator can fine tune the receiver.

Figure 2:
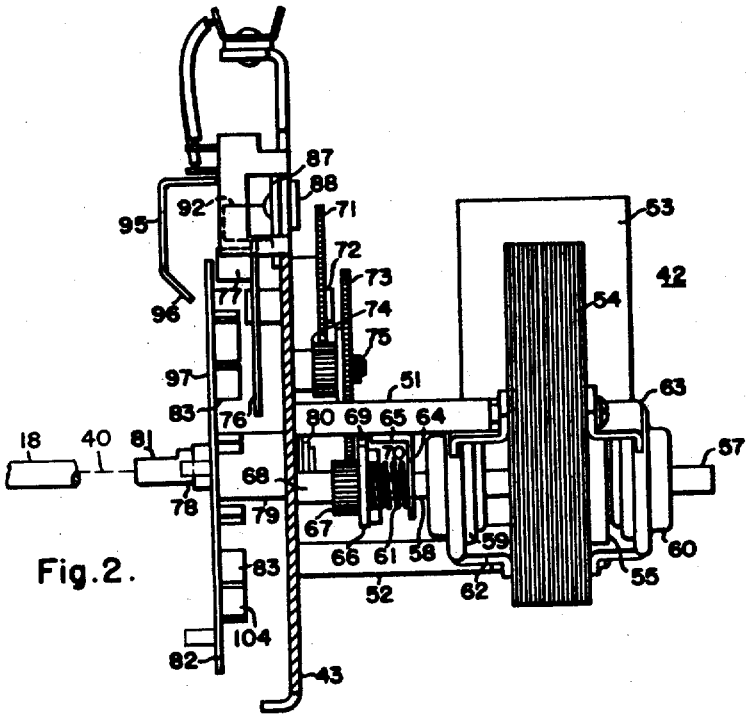
FIG. 2 is a side elevation of the drive mechanism represented in FIG. 1.
Figure 3:
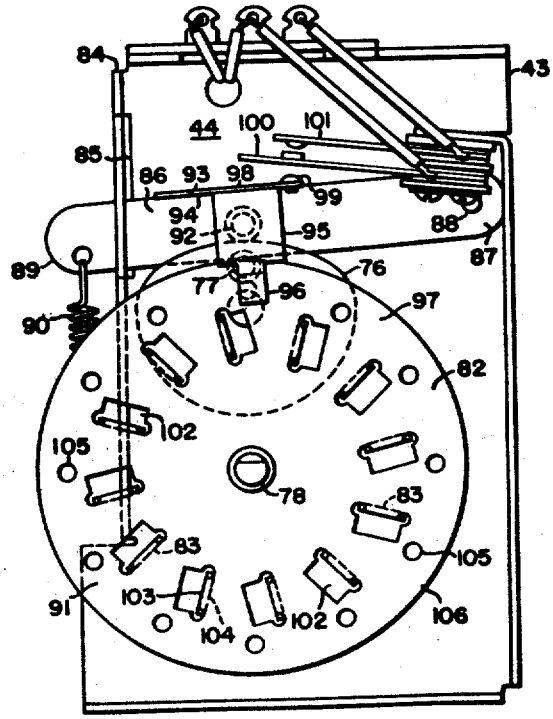
FIG. 3 is a front view of the drive mechanism of FIG. 2.

Referring to FIGS. 2 and 3 in detail, a prefererd channel-selection drive mechanism 41 comprises the motor 42 which is secured adjacent to the bracket 43 by means of two spaced support rods 51 and 52. The motor 42 is of the shaded-pole type having main windings 53 wound on the magnetic field structure or core 54, and a rotor 55. The rotor 55 is secured to the motor shaft 57 which has one part 58 journaled in bearings 59 and 60 and another integral part 61 whose free end is journaled in a bearing provided by an aperture in the bracket 43. The bearings 59 and 60 are connected to the core 54 by means of brackets 62 and 63.

A driving clutch member 64 is positioned adjacent to the bearing 59 near one end of the part 58 and secured in non-rotatable relation with respect to the motor shaft 57. The driving clutch member 64 is provided with a lateral projection 65. A driven clutch member 66, to which is attached a pinion 67, is slidably mounted on the part 61 of the motor shaft 57. A spacer 68 encircles a portion of the part 61 and prevents axial movement of the driven clutch member 66 and pinion 67 in the direction towards the rear of the bracket 43. The lateral projection 65 on the clutch member 64 is adapted to engage an outwardly projection portion 69 of the clutch member 66. A coil spring 70 is positioned between the clutch members 64 and 66, and this spring normally holds the clutch member 64 in such an axial position that the lateral projection 65 is out of engagement with the projecting portion 69 of the clutch member 66.

When the motor 42 is initially energized by closing of the switch 50 at the remote control unit 11, the motor shaft 57 will be rotated. At the same time the solenoid action of the motor will urge the motor shaft axially forward against the bias of the spring 70 in the direction towards the rear of the bracket 43. When the portion 58 of the motor shaft 57 is abutting the clutch member 66, the lateral projection 65 on the clutch member 64 will engage the projecting portion 69 on the clutch member 66. The pinion 67 will rotate at the speed of rotation of the motor shaft 57. Thus, when the motor 42 is initially energized, the clutch member 64 is moved to a coupling position with the clutch member 66, and when the motor is deenergized, the spring 70 instantly moves the clutch member 64 to a normally inoperative position.

The pinion 67 is *operatively* connected to a gear wheel 71 which is keyed to a rotatable shaft 72 through a gear wheel 73 and pinion 74. The gear wheel 73 and pinion 74 are rotatably attached to an intermediate shaft 75. The shaft 75 is attached to the rear of the bracket 43. The gear wheel 71 is mounted adjacent the rear side of the bracket 43 at one end of the shaft 72. The shaft 72 extends through an aperture provided in the bracket 43. At the end of shaft 72 is secured a cam 76. The cam 76 is located adjacent to the front side of the bracket 43 in non-rotatable relation with respect to shaft 72. The cam 76 is generally heart-shaped and at substantially its low point is mounted a roller 77. A tuner driving shaft 78 is located adjacent the front of the bracket 43 and is supported in a bearing 79 loacted in an aperture provided in the bracket. The end of the tuner driving shaft 78 at the rear of the bracket is provided with a retaining ring 80 which holds the shaft 78 in a substantially fixed axial position with relation to the bracket 43. The end of the tuner driving shaft 78 adjacent the front of the bracket 43 has a cut-out portion 81 which is adapted to interlock with the part 18 of the tuner shaft 13 through the flexible coupling 40. The rotation of the tuner driving shaft 78 will therefore rotate the tuner shaft 13 to permit channel selection by means of the remote control unit 11.

To the rear of the cut-out portion 81 on the shaft 78 is attached a circular member 82 which is secured in non-rotatable relation with respect to the shaft 78. The circular member 82 is a modified Geneva wheel and is provided with a plurality of tabs 83 which extend rearwardly from the member in the direction of the front of the bracket 43. The number of tabs 83 provided corresponds to the number of channel detent positions of the tuner 12. At the top of the bracket 43 there is provided a flange portion 84 which is turned outwardly in the direction of the circular member 82. A substantially rectangular-shaped aperture 85 is provided in the flange portion 84.

The channel-selection drive mechanism 41 also comprises a lever 86 which has one end 87 pivotally connected to the front of the bracket 43, as by the fastener 88, and another end 89 which extends through the aperture 85 in the flange portion 84. The end 89 of the lever 86 is adapted to slide in the aperture 85 in a direction transverse to the plane of the bracket 43. A tension spring 90 is connected between the end 89 and the top of the bracket, as at 91. A roller 92 is attached to the lever 86 at substantially its mid-point. The lever 86 has a flange portion 93. At the inner side 94 of the flange portion 93 is attached a substantially L-shaped resilient member 95 having an end portion 96 which extends above the outer surface 97 of the circular member 82 and projects inwardly towards this outer surface. The outer side 98 of the flange portion 93 is provided with an insulated disc 99 adapted to bear against one segment 100 of the switch 44. The segment 100 is in turn adapted to bear against the other segment 101. The disc 99 is therefore adapted to close the switch 44 and thus keep motor 42 operating once it is energized by the closure of the switch 50 at the remote control unit 11. It will be seen that the switch 44 is connected in a holding circuit for the motor 42.

In the embodiment shown, the circular member 82 is provided with twelve spaced openings 102 which have a susbtantially rectangular configuration. The tabs 83 are formed of the material punched out of the circular member 82 to form these openings. Alternately, the tabs 83 may comprise attachments to the member 82. The tabs 83 extend inwardly in the direction towards the front of the bracket 43 and they have inner and outer surfaces 103 and 104. The roller 77 on the cam 76 is adapted to successively bear against the inner surfaces 103 of the tabs 83 to cause partial rotation of the circular member 82 and the tuner driving shaft 78. The circular member 82 is provided with twelve apertures 105, spaced so that there is one for each of the tabs 83. The apertures 105 are located between the openings 102 in the member 82 and the edge 106 of the circular member 82. A programming member may be inserted in one or more of the apertures 105 when it is desired that the circular member 82 by-pass a particular channel position.

The operation of the remote control system is as follows: Assuming that the circular member 82 is in a normal stop position, such as represented in FIG. 3, the roller 92 on the lever 86 is touching the edge of the cam 76 at its low point. The tuner driving shaft 78 is connected through the coupling 40 to the tuner shaft 13. The tuner shaft 13 is at a particular channel position. In this case, a different channel position may be locally selected by rotation of the tuner shaft 13. The tuner driving shaft 78 and circular member 82 are free to rotate as the roller 77 on the cam 76 is not in engagement with one of the tabs 83. To select a different channel position by means of the remote control unit 11, the push button switch 50 is depressed to initially energize the motor 42. The rotor 55 of the motor 42 starts to rotate which turns the motor shaft 57. The motor shaft 57 is caused to move axially towards the rear of the bracket 43. This axial movement is effected by the thrust or pull of the motor 42 on the rotor 55 and overcomes the pressure of the spring 70 to cause the clutch member 64 to engage the clutch member 66. The pinion 67 attached to the clutch member 66 drives the gear wheel 73 and pinion 74 which is free to rotate on the shaft 75. The pinion 74 in turn drives the gear wheel 71 at a reduced rate of speed with relation to the rate of speed of the motor shaft 57. The rotation of the gear wheel 71 causes the cam 76 to rotate and the roller 77 engages the outer surface 104 of one of the tabs 83 in a typical Geneva harmonic motion. This Geneva motion causes a partial rotation of the tuner drive shaft 78 which is coupled to the tuner shaft 14, moving the shaft 14 from one channel detent or predetermined position to a succeeding one.

The cam 76 is in its rest position when the roller 92 on the lever 86 is against the low point of the cam. One complete revolution of the cam 76 corresponds to a single channel movement of the tuner shaft 14. During its revolution, the edge of the cam 76 moves the roller 92 in a direction against the bias of spring 90 in a constant acceleration motion, causing the insulated disc 99 to close the segments 100 and 101 of the switch 44. As the cam 76 continues to rotate, it goes through a dwell period, holding the insulated disc 99 operative to keep the switch 44 closed. As the cam 76 rotates through the last portion of its revolution, the lever 86 moves in the direction towards the tuner driving shaft 78, aided by the action of the tension spring 90. At this period in the revolution of the cam 76, the insulated disc 99 ceases to hold the segments 100 and 101 of the switch 44 closed. If the operator at the remote control unit 11 has, previous to this time, ceased to depress the button which closes the switch 50, then the motor 42 will now be deenergized. The rotary momentum effect of the rotor 55 on the tuner drive shaft 78 is removed by declutching the motor shaft 57 from the clutch member 66 through the action of the spring 70. The spring 70 instantly forces the motor shaft 57 axially away from the clutch member 66, since there is now no solenoid action in the deenergized motor. The rotary momentum of the gear wheels 71 and 73 on the tuner drive shaft 78 is overcome by the braking action of the roller 92 on the edge of the cam 76 at its low point. The entire channel-selection drive mechanism 41 comes to a complete stop in a precisely determined position, that is, with the roller 92 in contact with the edge of the cam 76 at its minimum radius position or low point. In this position the tuner driving shaft 78, which is coupled in the tuner shaft 13, is free to rotate permitting complete local operation of the tuner 12.

As described above, one revolution of the cam 76 corresponds to one tuner channel movement. Corresponding to the cam revolution is the transverse movement of the lever 86. When the roller 77 on the cam 76 disengages a tab 83, the lever 86 starts to move in the direction towards the tuner driving shaft 78. If a programming member is provided in the next one of the apertures 105, the lever 86 will be prevented from moving under the action of spring 90 to a point where the insulated disc 99 will no longer bear against the switch segment 100. This is effected by means of the end portion 96 of the member 95 abutting the programming member and arresting the motion of the spring 90. The lever 86 is held in position so that the switch 44 remains closed and the motor 42 continues to be energized, causing the cam 76 to go through another cycle of operation without stopping.

It will be apparent from the above description that for any channel position which it may be desirable to by-pass, a corresponding programming member may be placed in the appropriate aperture 105 on the circular member 82. If the tuner 12, through local operation, is inadvertently left in a programmed channel position, the operation of the channel-selection drive mechanism 41 may tend to jam the end portion 96 of the member 95 under a programming member on the side of the programming member adjacent one of the openings 102 in the circular member 82. For this reason, the end portion 96 is made of spring material with a long cantilever action, and it is so designed as to ride over the top of the programming member on the outward stroke of the lever 86 in the direction away from the tuner driving shaft 78.

Figure 4:
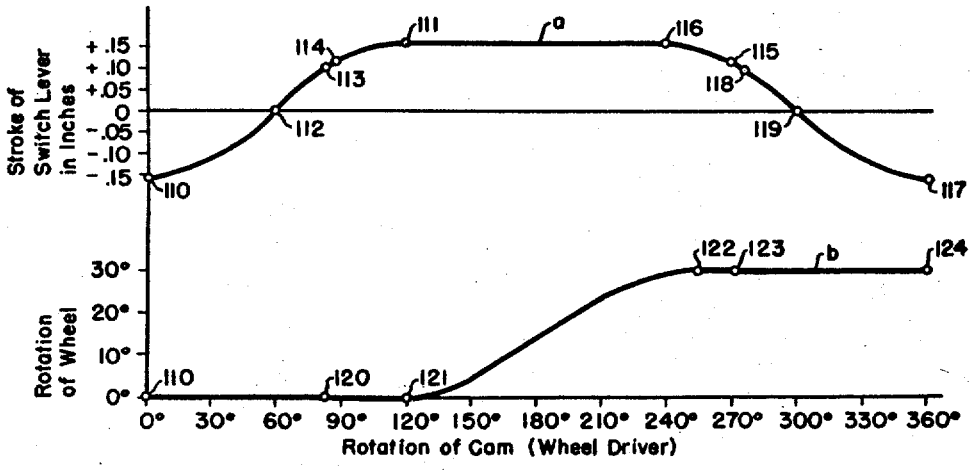
FIG. 4 shows a set of curves helpful in explaining our invention.

In FIG. 4 curve a represents a plot of the rotation of the cam 76 in degrees against the stroke of the lever 86 in inches. At the greatest minus value of curve a, the lever 86 would be in the rest position as shown in FIG. 3, and the tuner shaft 13 would be at a channel position. In FIG. 4, curve b represents a plot of the rotation of cam 76 in degrees against the rotation of the circular member 82 and tuner driving shaft 78 in degrees. At point 110 on both curves of FIG. 4, the cam 76 will be in its rest position. From point 110 to point 111 on curve a, there will be constant outward acceleration of the stroke of the lever 86. Between points 112 and 113, the insulating disc 99 on the lever 86 will close the segments 100 and 101 of the switch 44. At point 114, the end portion 96 of the member 95 will leave a programming member, and at point 115 the end portion 96 will abut the next succeeding programming member if one is provided at that location. From point 116 to point 117, there is again constant acceleration of the stroke of the lever 86 but in an inward direction. Between points 118 and 119, the insulating disc 96 will move away from the segment 100, and the switch 44 will open, causing deenergization of the motor 42. On curve b, at point 120, the roller 77 on the cam 76 will be adjacent the inner side 103 of the circular member 82. At point 121, the roller 77 will contact a tab 83, and at point 122, the roller 77 will disengage from the tab. From points 121 to 122, the roller 77 engages a tab 83 in a Geneva harmonic motion. At point 123, the roller 77 will no longer be adjacent the inner side 103 of the circular member 82, and at point 124, the circular member 82 and the tuner driving shaft 78 will have rotated substantially 30° which corresponds to a single channel movement of the tuner 12.

While we have shown our invention in a preferred form, it will be obvious to those skilled in the art that it is not so limited but is susceptible of various changes and modifications without departing from the spirit and scope thereof.

We claim as our invention:

[1. In apparatus for controlling the angular movement of a shaft, the combination of, a first rotary shaft, a member movable with said shaft and coaxial therewith, said member having a plurality of radially spaced tabs, a second rotary shaft having a gearing and a cam movable with said second shaft, means associated with said cam for contacting said tabs to move angularly said first shaft a predetermined amount, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam operated switch means for closing said holding circuit in response to actuation of said cam until the angular movement of said first shaft has progressed substantially said predetermined amount, said last-mentioned means including a part thereof in contact with said cam.]

[2. In apparatus for controlling the angular movement of a shaft, the combination of a first rotary shaft, a member movable with said shaft and coaxial therewith, said member having a plurality of radially spaced tabs extending from one side thereof, a second rotary shaft having a gearing and a cam movable with said second shaft, means associated with said cam for contacting said tabs to move angularly said first shaft to a predtermined position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam following switch means in contact with said cam for closing said holding circuit in response to actuation of said cam, said last-mentioned means also including means for making said holding circuit ineffective and for locating said first shaft at said pedetermined position after said holding circuit is made ineffective.]

[3. In apparatus for controlling the angular movement of a shaft, the combination of a first rotary shaft, a member movable with said shaft and coaxial therewith, said member having a plurality of radially spaced tabs extending from one side thereof, a second rotary shaft having a gearing and a cam movable with said second shaft, means associated with said cam for contacting said tabs to move angularly said first shaft to a predetermined position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, cam follower switch means in contact with said cam for closing said holding circuit in response to actuation of said cam, said last-mentioned means also including means for making said holding circuit ineffective and for locating said first shaft at said pedetermined position after said holding circuit is made ineffective, and means for automatically disengaging the means carried by said motor shaft from the gearing on said second shaft after said holding circuit is made ineffective.]

4. In an arrangement for remote control of the tuning control shaft of a television receiver, said control shaft adapted to be actuated to a plurality of predetermined positions, the combination of a first rotary shaft coupled *to said control shaft, a wheel rotatable with said first* [to said control shaft, a member rotatable with said first] shaft having a plurality of radially spaced tabs extending from one side thereof and corresponding in number to the number of said predetermined positions, a second rotary shaft carrying a gearing, said second shaft also carrying cam means for successively contacting said tabs to move said first shaft and said control shaft to a particular one of said predetermined positions, said gearing and said *cam* [contacting] means being rotatable with said second shaft, an electric motor having a motor shaft axially movable to a predetermined limit of travel upon operation of said motor, *engaging* means carried by said motor shaft for engaging said gearing when said motor shaft reaches said predetermined limit of travel, a circuit for said motor having means located at a point remote from said receiver for initiating the operation of said motor, a holding circuit for said motor, cam follower switch means in contact with said [contacting] *cam* means for closing said holding circuit in response to a particular actuation of said engaging means[, said last-mentioned means also including means for] *and subsequently* making said holding circuit ineffective in response to a further actuation of said *cam* [contacting] means [and] for locating said control shaft at said one predetermined position after said holding circuit is made ineffective, and means for automatically disengaging the *said engaging* means [carried by said motor shaft] from the gearing on said second shaft after said holding circuit is made ineffective.

[5. In apparatus for controlling the angular movement of a shaft, the combination of a first rotary shaft, a circular member movable with said first shaft, said circular member having a plurality of radially spaced tabs, each of said tabs representing a final position of said first shaft, a second rotary shaft having a gearing and a cam movable with said second shaft, means associated with said cam adapted to contact successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, and cam follower switch means in contact with said cam for closing said holding circuit in response to a particular actuation of said cam, said last-mentioned means also including means for making said holding circuit ineffective in response to a further actuation of said cam and for locating said first shaft at said predetermined final position after said holding circuit is made ineffective.]

[6. In apparatus for controlling the angular movement of a shaft, the combination of a first rotary shaft, a circular member movable with said first shaft, said circular member having a plurality of radially spaced tabs, each of said tabs representing a final position of said first shaft, a second rotary shaft having a gearing and a cam movable with said second shaft, means associated with said cam adapted to contact successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means for initiating the operation of said motor, a holding circuit for said motor, switch means in contact with said cam for closing said holding circuit in response to a particular actuation of said cam, said last-mentioned means also including means for making said holding circuit ineffective in response to a further actuation of said cam and for locating said first shaft at said predetermined final position after said holding circuit is made ineffective, and means for automatically disengaging the means carried by said motor shaft from the gearing on said second shaft after said holding circuit is made ineffective.]

[7. In apparatus for controlling the angular movement of a shaft, the combination of a first rotary shaft, a circular member movable with said shaft, said circular member having a plurality of radially spaced tabs, each of said tabs representing a final position of said first shaft, a second rotary shaft having a gearing and a cam movable with said second shaft, means associated with said cam adapted to engage successively said tabs to move angularly said first shaft to a predetermined final position, an electric motor having a motor shaft axially movable to a predetermined limit of travel upon operation of said motor, means carried by said motor shaft for engaging said gearing when said motor shaft reaches said predetermined limit of travel, a circuit for said motor having means located at a point remote from said first shaft for initiating the operation of said motor, a holding circuit for said motor, switch means in contact with said cam for closing said holding circuit in response to a particular actuation of said cam, and means cooperating with said closing means for retaining said holding circuit closed until said first shaft is moved close to said predetermined final position, said closing means also including means for making said holding circuit ineffective in response to a further actuation of said cam and for locating said first shaft at said predetermined final position after said holding circuit is made ineffective.]

[8. In apparatus for controlling the angular movement of a shaft, the combination of, a first rotary shaft, a member movable with said shaft and coaxial thereof, said member have a plurality of radially spaced tabs extending from one side thereof, a second rotary shaft having a gearing and a cam movable with said second shaft, means associated with said cam for contacting said tabs to move angularly said first shaft a predetermined amount, an electric motor having a motor shaft, means carried by said motor shaft for engaging said gearing, a circuit for said motor having means for initiating the operation of said motor, a holding circuit for said motor, and switch means positioned so as to be actuated by said cam means for closing said holding circuit in response to actuation of said cam until the angular movement of said first shaft has progressed said predetermined amount, said last-mentioned means including a cam follower in contact with said cam.]

[9. In apparatus for controlling the angular movement of a shaft, the combination of, a first rotary shaft, a member movable with said shaft and coaxial thereof, said member having a plurality of radially spaced tabs extending from one side thereof, a second rotary shaft having a gearing and a cam movable with said second shaft, means associated with said cam for contacting said tabs to move angularly said first shaft a predetermined amount, an electric motor having a motor shaft, means carried by said motor shaft for engaging said gearing, a circuit for said motor having means for initiating the operation of said motor, a holding circuit for said motor, and switch means positioned so as to be actuated by said cam means for closing said holding circuit in response to one actuation of said cam and for making said holding circuit ineffective in response to a further actuation of said cam to locate said first shaft at said predetermined position when said holding circuit is made ineffective, said last-mentioned means including a cam follower in contact with said cam.]

*10. In an arrangement for remote control of the tuning control shaft of a television receiver, said tuning control shaft being actuatable from one position to another position by either manual or remote-electrical actuation, tuning control shaft, means carried on said shaft having a plurality of angularly spaced cam follower surfaces, motor drive means including a second rotary shaft and a motor coupled to said rotary shaft, cam means carried by said shaft for successively engaging said cam follower surfaces to impart intermittent-motion rotation to said shaft, a holding circuit for said motor, and switch means in contact with said cam means for maintaining closure of said circuit during engagement of said cam means with any one of said cam follower surfaces and for opening said circuit when said cam means reaches a predetermined angular position corresponding to the pause period of said intermittent-motion, manually operable means mechanically coupled to said shaft for actuating it independently of said motor drive means, said cam means being so constructed that when said cam means is at said predetermined angular position the same is outside the path traversed by said cam follower surfaces thereby providing for unimpeded manual actuation of said tuner from one position to another.*

*11. In an arrangement for remote control of the tuning control shaft of a television receiver, means operatively connected to said tuner for driving the same, means on said shaft having a plurality of circularly arranged and angularly spaced cam follower elements mounted to traverse a predetermined circular path upon rotation of said control shaft, motor drive means including a rotatable member positioned with its axis of rotation substantially parallel to that of said control shaft, cam means carried by said second member, said cam means having a reference position outside said circular path and being rotatable therefrom for individually engaging said cam follower elements to rotate said first member through a predetermined angle in response to each rotation of said member, a motor operatively connected to said rotatable member, a holding circuit for said motor, switch means including a pair of switch contacts connected in said holding circuit, and switch operating means responsive to said cam means for holding said contacts closed to complete said holding circuit, said last mentioned means being operative when said cam means is away from said reference position to effect actuation of said motor and prevent said cam means from stopping within said circular path thereby providing for unimpeded inter-channel actuation of said receiver independently of said cam means and manually operable means mechanically coupled to said receiver for rotating it independently of said motor drive means.*

*12. In apparatus for controlling angular movement of a shaft, a first rotatable member, means on said member having a plurality of circularly arranged and angularly spaced cam follower elements mounted to traverse a circular path upon rotation of said first member, a second rotatable member positioned with its axis substantially parallel to that of said first member, cam means carried by said second member for rotating said first member through a predetermined angle in response to each rotation of said second member, said cam means having a reference position outside said circular path and being rotatable from said reference position to individually and successively engage said cam follower elements, drive means including a motor coupled to drive said second member, a holding circuit for said motor, switch means connected in said holding circuit, and switch operating means responsive to the angular position of said cam means for activating said holding circuit when said cam means is away from said reference position thereby effecting actuation of said motor preventing said cam means from stopping within said circular path and providing for unimpeded rotation of said first member independently of said drive means.*

*13. In apparatus for controlling the angular movement of a shaft, manually operable means operatively connected to said shaft for rotatable contact element, manually operable means operatively connected to said contact element for rotating said shaft, remotely controllable actuating means including a prime mover operatively connected to said shaft for alternatively actuating said shaft, intermittent-motion gear means operatively connected between said prime mover and said shaft, said gear means comprising a first rotatable member, a plurality of circularly arranged and angularly spaced cam follower elements carried on said rotatable member and adapted to traverse a circular path upon rotation of said first member, a second rotatable member positioned with its axis of rotation substantially parallel to that of said first member, eccentric cam means carried by said second member, said cam means having a reference position outside said circular path and being rotatable to positions within said path for individually engaging said cam follower elements, said prime mover operatively connected to said second rotatable member to drive said second rotatable member and means to prevent said remotely controllable actuating means from stopping said second rotatable member at positions to interfere with manual rotation of said contact member; said last-mentioned means comprising a holding circuit for said prime mover including a switch, and switch actuating means including a rotatable cam element operatively connected with said second rotatable member for activating said holding circuit whenever said cam means is within said circular path and for deactivating said holding circuit only when said cam means is at said reference position thereby assuring that said cam means will come to rest only at positions outside said circular path.*

*14. In an arrangement for remote control of the tuning control shaft of a television receiver, said tuning control shaft rotatably movable in steps to a pluralty of angularly spaced detent positions, an intermittent-motion gear member carried on said control shaft for rotation therewith and having a plurality of angularly spaced cam follower elements individually corresponding to said detent positions, a second shaft, cam means carried on said second shaft and rotatable to individually and successively engage said cam follower elements for rotating said control shaft through a predetermined angle corresponding to the inter* tent angle of said tuner, a motor coupled to drive said m means, a holding circuit for said motor, switch means ectrically connected in said holding circuit and responve to said cam means for activating said holding circuit henever said cam means is within the path traversed by id cam follower elements, a plurality of skip-channel ogramming members associated with said intermittentotion gear member, a switch operator having first and cond positions and operative when in said second posion to cause said switch means to continuously maintain id holding circuit, with each of said programming memers being individually positionable to contact said switch erator and retain said switch operator at said second sition during traversal of the detent position correspondg to selection of a particular television channel.

15. In an arrangement for remote control of the tuning ntrol shaft of a television receiver, said tuning control aft rotatably movable in steps to said angularly spaced sitions, an intermittent-motion gear member carried on id control shaft for rotation therewith and having a urality of angularly spaced cam follower elements correonding to said spaced positions, a second shaft, cam eans supported on said second shaft and rotatable to invidually and successively engage said cam follower eleents for rotating said control shaft through a predermined angle corresponding to the inter-detent angle of e channel selector mechanism in response to each revolun of said cam means, a motor coupled to said cam eans, a holding circuit for said motor including a switch, eans responsive to the angular position of said cam eans for closing said switch to activate said holding cirit when said cam means is within the circular path trarsed by said cam follower elements and means for setively retaining said switch in the closed position when id gear member is at selected undesired channel posins, said last-mentioned means comprising a plurality skip-channel programming members mounted at anlarly spaced locations on said intermittent-motion gear ember adjacent the periphery thereof, said spaced locans individually corresponding to different ones of said tent positions, and switch operating means positioned be actuated by selectively positioned ones of said proamming members when said gear member is rotated to gular positions corresponding respectively to selection the particular channels represented by each of said ogramming members.

16. In apparatus for controlling angular movement of shaft, a first rotary shaft, coupled to said shaft a member tatable with said first shaft and having a plurality of cularly arranged angularly spaced cam follower eleents, each of said elements representing an angular inx position of said first shaft, a second rotary shaft having axis substantially parallel to and spaced from the axis said first shaft, cam means movable with said second aft and including an eccentric element to individually d successivly engage said cam follower elements to move id first shaft through a predetermined angle from one dex position to the next index position in response to ch revolution of said second shaft, drive means includ a motor operatively connected to said second shaft to tate said second shaft, circuit means to enerize said otor, a holding circuit connected to said motor, switch eans actuated by said cam means to close said holding cuit when said first shaft moves away from one of said dex positions and to open said holding circuit upon the aching of another of said index positions, a plurality of dex members rotatable with said first shaft and invidually corresponding to different ones of said index sitions, with each of said index members being selecely positionable to engage said switch means and prent deenergization of said motor during movement of d first shaft through the corresponding index position.

17. In an arrangement for remote control of the tuning ntrol shaft of a television receiver, said tuning control aft to be rotatable from one channel index position to another channel index position by either manual or remote-electrical actuation, the combination comprising an actuating shaft operable to drive said control shaft, a Geneva wheel coupled to said actuating shaft to effect intermittent-motion rotary movement of said actuating shaft, said wheel having a plurality of angularly spaced cam follower elements, rotary means having a reference position to engage said elements to drive said wheel from one index position to another index position by a single full rotation from and to said reference position, a holding circuit including a switch connected to said motor to maintain energization of said motor during intervals substantially corresponding to a single full rotation of said rotary means, switch actuating cam means operatively connected to said rotary means to hold said switch closed during said intervals and to open said switch when said rotary means reaches said reference position, said rotary means when at said reference position being disengaged from said cam follower elements to permit manual actuation of said tuning control shaft independently of said rotary means.

18. Apparatus for controlling angular movement of a shaft comprising, a first rotary shaft coupled to said shaft, a wheel rotatable with said first shaft and having a plurality of circularly arranged angularly spaced cam follower elements, each of said elements representing an angular index position of said first shaft, a second rotary shaft, cam means movable with said second shaft to individually and successively engage said cam follower elements to move said wheel and said first shaft through a predetermined angle from one index position to the next index position in response to each revolution of said second shaft, drive means including a motor operatively connected to said second shaft to rotate said second shaft, second means to energize said motor, a holding circuit connected to said motor, switch means actuated by said cam means to close said holding circuit when said first shaft rotates away from said one index position and responsive to rotation of said first shaft from said one index position to said other index position to open said holding circuit, and a plurality of index members rotatable in response to rotation of said first shaft individually corresponding to different ones of said index positions with each of said index members being selectively positionable to operatively engage said switch means and prevent deenergization of said motor during movement of said first shaft after reaching said other index position.

19. In an arrangement for remote control of the tuner, control shaft of a television receiver, said tuning control shaft to be rotatable from one channel index position to another channel index position, an actuating shaft coupled to said tuning control shaft, a wheel coupled to said actuating shaft to effect intermittent rotary motion thereto, said wheel having a plurality of angularly spaced cam follower elements, cam means rotatable during a first portion of a full revolution to engage one of said cam follower elements to thereby rotate said tuning control shaft from said one index position to said other index position, a holding circuit including a switch connected to said motor to maintain energization of said motor during intervals substantially corresponding to movement of said tuning control shaft from said one index position to said other index position, and switch actuating means operatively connected to said cam means to hold said switch closed during continued rotation of said cam means from said other index position to said index position.

20. In an arrangement for remote control of the tuning control shaft of a television receiver, said tuning control shaft being rotatable from one channel index position to another channel index position, an actuating shaft operable to drive said tuning control shaft, a wheel coupled to said actuating shaft to effect intermittent rotary movement of said actuating shaft, said wheel having a plurality of angularly spaced cam follower surfaces, cam means having first and second cam surfaces rotatable about an axis, said first surface responsive to rotary movement of

*said cam means through a first portion of rotation of said cam means to rotate said wheel, motor means operatively connected to said cam means to effect rotation of said cam means through said first portion, a holding circuit including a switch connected to said motor to maintain energization of said motor during said first portion of movement, switch means, and index means mounted on said wheel and positioned to be coupled to said switch means during said second portion of rotation of said cam means to maintain actuation of said holding circuit.*

*21. In apparatus for controlling angular movement of a shaft, the combination of: a first rotary shaft coupled to said shaft; a wheel rotatable with said first shaft and having a plurality of circularly arranged angularly spaced cam follower elements, each of said elements representing an angular index position of said first shaft; a second rotary shaft; cam means rotatable with said second shaft to individually and successively engage said cam follower elements to move said wheel and said first shaft through a predetermined angle from one index position to the next index position in response to each revolution of said second shaft; drive means including a motor operatively connected to said second shaft to rotate said second shaft; actuating means for energizing said motor in response to said cam means when said first shaft rotates away from said one index position and to deenergize said motor when said first shaft rotates from said one index position to said other index position; and a plurality of index members rotatable in response to rotation of said first shaft individually corresponding to different ones of said index positions with each of said index members being selectively positionable to prevent deenergization of said motor during movement of said first shaft after reaching said other index position.*

*22. In an arrangement for remote control of the tuning control shaft of a television receiver, the combination of: a first rotary shaft coupled to said tuning control shaft; a wheel rotatable with said first shaft and having a plurality of circularly arranged angularly spaced cam follower elements, each of said elements representing an angular index position of said first shaft; a second rotary shaft; cam means rotatable with said second shaft to individually and successively engage said cam follower elements to*

*move said wheel and said first shaft through a predetermined angle from one index position to the next index position in response to each revolution of said second shaft; drive means including a motor operatively connected to said second shaft to rotate said second shaft; actuating means for energizing said motor in response to said cam means when said first shaft rotates away from said one index position and to deenergize said motor when said first shaft rotates from said one index position to said other index position; and a plurality of index members rotatable in response to rotation of said first shaft individually corresponding to different ones of said index positions with each of said index members being selectively positionable to prevent deenergization of said motor during movement of said first shaft after reaching said other index position.*

References Cited in the file of this patent or the original patent

UNITED STATES PATENTS

| | | |
|---|---|---|
| 841,342 | Richards | Jan. 15, 1907 |
| 850,905 | Busse | Apr. 23, 1907 |
| 2,204,065 | Beizer et al. | June 11, 1940 |
| 2,445,031 | McDonald | July 13, 1948 |
| 2,702,609 | Frazier | Feb. 22, 1955 |
| 2,745,016 | Kulikowski et al. | May 8, 1956 |
| 2,760,139 | Luebking | Aug. 21, 1956 |
| 2,774,245 | Shepard | Dec. 18, 1956 |
| 2,784,599 | Moulin | Mar. 12, 1957 |
| 2,820,370 | Dolesh | Jan. 21, 1958 |
| 2,833,976 | Kennedy et al. | May 6, 1958 |
| 2,866,898 | Race | Dec. 30, 1958 |
| 2,881,322 | Allison | Apr. 7, 1959 |
| 2,929,259 | Chamberlin | Mar. 22, 1960 |
| 2,979,971 | Darash | Apr. 18, 1961 |
| 2,985,029 | Schneider | May 23, 1961 |
| 3,033,999 | Thornberry | May 8, 1962 |

FOREIGN PATENTS

| | | |
|---|---|---|
| 118,168 | Australia | Mar. 9, 1944 |
| 125,512 | Australia | Oct. 2, 1947 |
| 714,206 | Germany | Nov. 24, 1951 |